(12) United States Patent
Hawrylak et al.

(10) Patent No.: US 7,737,432 B2
(45) Date of Patent: Jun. 15, 2010

(54) VOLTAGE CONTROLLED COMPUTING ELEMENT FOR QUANTUM COMPUTER

(75) Inventors: Pawel Hawrylak, Gloucester (CA); Marek Korkusinski, Gloucester (CA)

(73) Assignee: National Research Council of Canada, Ottawa (CA)

( * ) Notice: Subject to any disclaimer, the term of this patent is extended or adjusted under 35 U.S.C. 154(b) by 768 days.

(21) Appl. No.: 11/570,645

(22) PCT Filed: Jun. 14, 2005

(86) PCT No.: PCT/CA2005/000920

§ 371 (c)(1),
(2), (4) Date: Dec. 14, 2006

(87) PCT Pub. No.: WO2005/124674

PCT Pub. Date: Dec. 29, 2005

(65) Prior Publication Data

US 2008/0237576 A1  Oct. 2, 2008

Related U.S. Application Data

(60) Provisional application No. 60/579,234, filed on Jun. 15, 2004.

(51) Int. Cl.
*H01L 31/00* (2006.01)
*H01L 29/08* (2006.01)
*H01L 21/337* (2006.01)

(52) U.S. Cl. .................. 257/14; 257/24; 257/E21.404; 438/172

(58) Field of Classification Search .................. 257/14, 257/20, 24, 9, 321, E33.008, E31.033, E29.071, 257/E29.168, E49.003, E21.404; 438/962, 438/142, 151, 157, 766, 770, 478, 44, 42
See application file for complete search history.

(56) References Cited

U.S. PATENT DOCUMENTS 6,472,681 B1 * 10/2002 Kane ........................... 257/14
2002/0179897 A1 * 12/2002 Eriksson et al. ............... 257/14

* cited by examiner

*Primary Examiner*—Thomas L Dickey
*Assistant Examiner*—Nikolay Yushin
(74) *Attorney, Agent, or Firm*—Marks & Clerk; Richard J. Mitchell

(57) ABSTRACT

A computing element for use in a quantum computer has at least three coupled quantum dots, and at least one gate for applying an electric field to manipulate the state of said qubit.

25 Claims, 4 Drawing Sheets

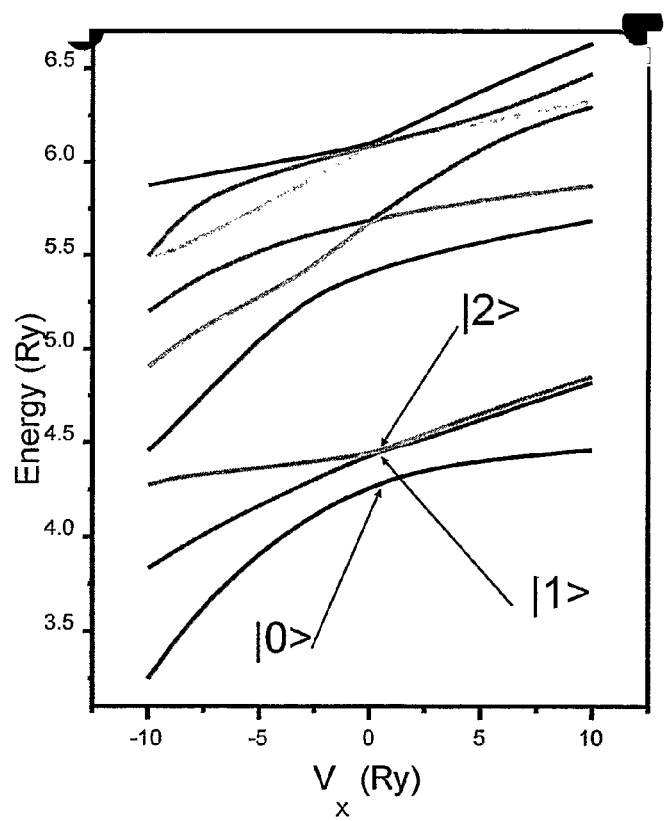
Fig.2a
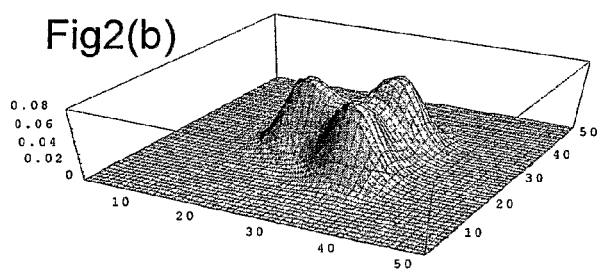
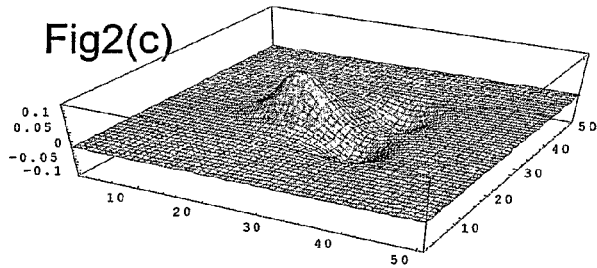
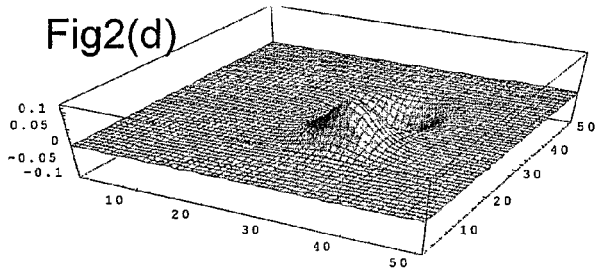

VOLTAGE CONTROLLED COMPUTING ELEMENT FOR QUANTUM COMPUTER

CROSS-REFERENCE TO RELATED APPLICATION

This application claims the benefit under 35 USC 119(e) of prior U.S. provisional application No. 60/579,234 filed Jun. 15, 2004.

FIELD OF THE INVENTION

This invention relates to the field of quantum computing, and in particular to a novel computing element that provides a coded qubit that can be suitably manipulated.

BACKGROUND OF THE INVENTION

As is well known in the art, conventional computers work with binary digits or bits, which can exist in either a logical state 1 or 0. In a quantum computer, the fundamental unit of information (called a quantum bit or qubit), can exist not only in a state corresponding to the logical state 0 or 1 as in a classical bit, but also in states corresponding to a blend or superposition of these classical states. In other words, a qubit can exist as a zero, a one, or simultaneously as both 0 and 1, with a numerical coefficient representing the probability for each state. This qubit property arises as a direct consequence of its adherence to the laws of quantum mechanics which differ radically from the laws of classical physics. A physical realization of a qubit is a spin of an electron.

Quantum computation requires qubits which simultaneously satisfy contradictory requirements of both maintaining coherence and yet allowing for easy contact to perform quantum operations. Feynman, R. P., Quantum mechanical computers, *Foundations of Physics* 16, 507 (1986); Bennett, C. H. & DiVincenzo, D. P., Quantum information and computation, *Nature* 404, 247 (2000); Nielsen, M. A., Knill, E., & Laflamme, R., Complete quantum teleportation using nuclear magnetic resonance, *Nature* 396, 52 (1998); and Vandersypen, L. M., et al., Experimental realization of Shor's quantum factoring algorithm using nuclear magnetic resonance, *Nature* 414, 883 (2001).

It is known that coherence is well preserved in electron spin while operations are best performed on its charge using gates and voltages. Unfortunately, voltage does not couple to electron spin. The quantum operations on a localized electron spin require either nanoscale magnetic fields or complex g-factor engineering combined with spatial manipulation of electron position using voltage controlled surface gates.

Despite tremendous progress in localizing and controlling single electron spin so far no-one has been able to demonstrate a single-qubit operation for qubits based on electron spin.

An alternative solution to the problem of qubit operations on a single spin was proposed by DiVincenzo and collaborators, DiVincenzo, D. P, et al., Universal quantum computation with the exchange interaction, *Nature* 408, 339 (2000), who suggested quantum computation with exchange interaction. DiVincenzo's basic idea is to replace the two level system based on single-electron spin with selected levels of a composite object consisting of several spins. The manipulation of selected quantum levels proceeds not through operations on single spins but through the manipulation of the coupling J between neighbouring spins due to exchange interaction. For example, two qubit states $|0\rangle$ and $|1\rangle$ for a single total spin $S=\frac{1}{2}$ can be identified with two opposite spin directions ($S_z$) up and down: $|0\rangle=|\downarrow\rangle$ and $|1\rangle=|\uparrow\rangle$.

SUMMARY OF THE INVENTION

In accordance with the principles of the present invention the advantage of long coherence times intrinsic to electron spin is combined with the advantages of voltage control of electron charge. This results in the design of a realistic coded qubit that can be operated by electrical means.

According to a first aspect of the invention there is provided a computing element for a quantum computer comprising at least three coupled quantum dots that can adopt more than one state, and at least one gate for applying an electric to manipulate the collective state of said coupled quantum dots.

In one embodiment the invention employs a three-electron complex in three tunable gated quantum dots. The two logical states $|0L\rangle$ and $|1L\rangle$ of a qubit reside in a degenerate subspace of total spin $S=\frac{1}{2}$ states. Applying voltages to selected gates allows for the manipulation of the coded qubit. The technology can be scaled up to produce a working quantum computer.

In another aspect the invention provides a method of creating a qubit for use in quantum computing comprising creating a two dimensional electron gas; creating at least three coupled quantum dots in said two dimensional electron gas, said couple quantum dots having more than one collective state; and manipulating said qubit by selectively applying an electric field to said quantum dots.

BRIEF DESCRIPTION OF THE DRAWINGS

The invention will now be described in more detail, by way of example only, with reference to the accompanying drawings, in which:

FIG. 2a shows the energies of the nine lowest single-electron levels of the three-dot system as a function of voltage applied to the gate $V_x$;

FIGS. 2b-2d show the wave functions corresponding to the three lowest single-electron energy levels of the three-dot system;

DETAILED DESCRIPTION OF THE PREFERRED EMBODIMENTS

In order to understand the invention, it will be first necessary to understand the underlying theory. In a coded qubit consisting of three localised electron spins (a, b, c) it is possible to select a total direction (total $S_z$) of the three spins, e.g., $|\downarrow\rangle$. A state with this direction can be realised by three different states: $|\downarrow a, \downarrow b, \uparrow c\rangle$, $|\downarrow a, \uparrow b, \downarrow c\rangle$, and $|\uparrow a, \downarrow b, \downarrow c\rangle$, which differ by the position of the spin pointing up. These three states can be grouped into a single state with total spin $S=3/2$ and two orthogonal states with total spin $S=1/2$. Examples of the two orthogonal spin states forming the two logical qubit states $|0L\rangle$ and $|1L\rangle$ are $|0L\rangle = 1/\sqrt{2}(|\downarrow a, \downarrow b, \uparrow c\rangle - |\downarrow a, \uparrow b, \downarrow c\rangle)$ and $|1L\rangle = 1/\sqrt{6}(|\downarrow a, \downarrow b, \uparrow c\rangle + |\downarrow a, \uparrow b, \downarrow c\rangle - 2|\uparrow a, \downarrow b, \downarrow c\rangle).$ The properties of a three-electron complex in a single quantum dot, including the two logical spin states can be analyzed theoretically and experimentally. The three-electron states are a product of the orbital and spin part. The spin part has been discussed in terms of the logical qubit states. But it is precisely the orbital part that can be manipulated using voltages, and hence it plays an important role in a coded qubit.

Following the methodology which allowed for a quantitative understanding of a single dot with controlled number of electrons to study the energy levels and spin and orbital wave functions of a realistic coded qubit, the inventors have shown that there exist two low-energy states, which map very well onto the two logical qubit states, which can be manipulated by applied voltages.

Figure 1A:
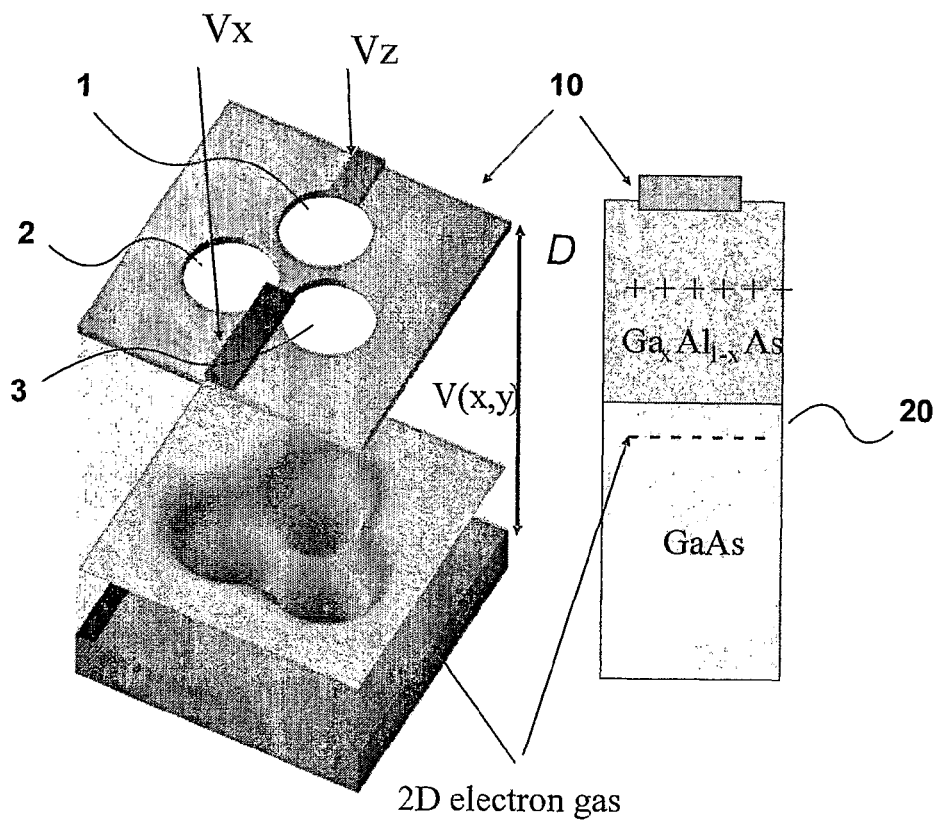
FIG. 1a is a cross sectional view of a coded cubit realized on three coupled gated lateral quantum dots; the right hand side shows the layer structure of the device: the metal gates, the GaAlAs semiconductor barrier layer doped with silicon donors, the GaAs layer containing electrons at the GaAs/GaAlAs interface.

One embodiment of a proposed device in accordance with the invention is shown schematically in FIG. 1a. It consists of a metallic gate 10 providing a mask defining three coupled lateral quantum dots 1,2,3. The dots are defined by locally depleting the two-dimensional electron gas (2DEG) at a distance D below the surface.

The quantum dots can be formed from a two dimensional gas in a GaAs/$Al_xGa_{1-x}$As heterostructure generally designated 20 with a metal electrode 10. Control gates $V_x$ and $V_z$ are provided as will be described in more detail. Theses gates must be insulated from the electrode 10. For example, the electrode 10 can be etched away in the vicinity of the gates. Typically a AlGaAs layer may be grown by MBE (Molecular Beam Epitaxy) on an GaAs sublayer and doped with silicon atoms, as shown in FIG. 1a. A two-dimensional electron gas can be formed at the interface by the combination of doping and the application of a suitable electric field. One method of making a lateral quantum dot is to electrostatically define it by four gates.

Figure 5A:
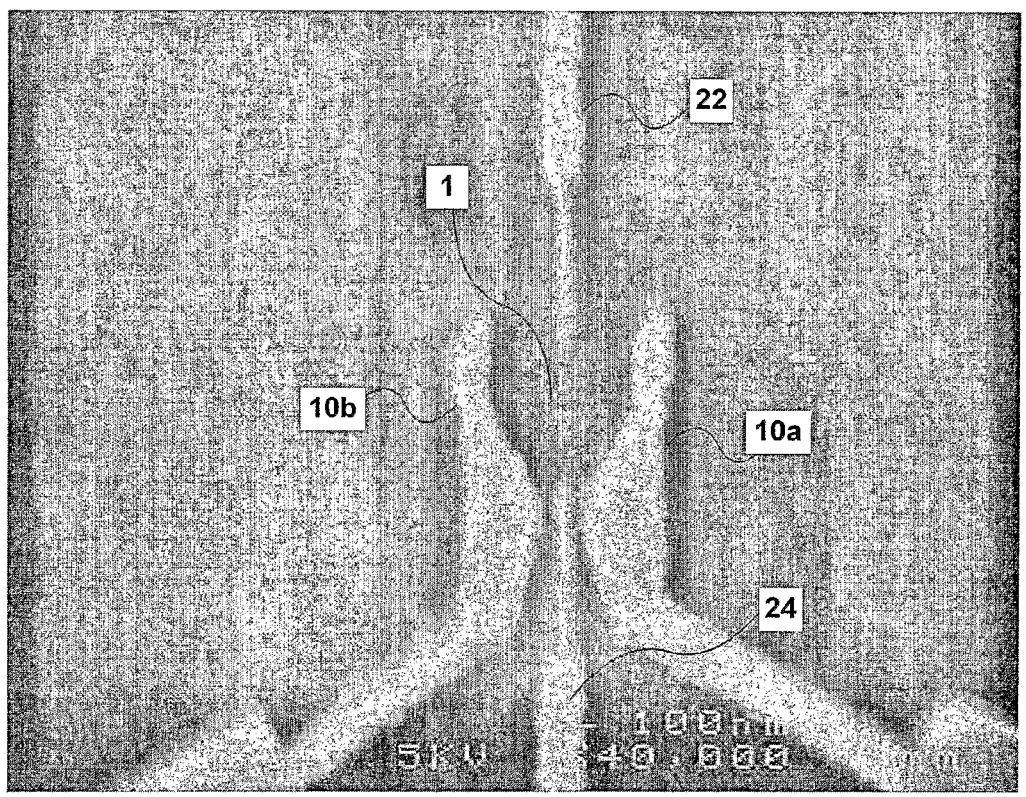
FIG. 5a is a scanning electron microscopy micrograph of an existing lateral quantum dot device capable of localizing a single electron and FIG. 5b shows two quantum dots 1, 2 with a single electron (schematically indicated by an arrow) in each.

FIG. 5a shows one such device. In this case, the dot is electrostatically defined by four gates above a GaAs/$Al_xGa_{1-x}$As heterostructure. In FIG. 5a, the gates 10a, 10b, 22, 24 can be etched from the applied metal electrode 10 defining the quantum dots, or they can be separately deposited. The structure in FIG. 5a uses a top "T" gate 22 in combination with left and right finger gates 10a, 10b to define the dot geometry. A narrow plunger gate 24, located in the gap between the left and right finger gates is used to vary the number of electrons. The lithographic width and height of the triangular dots was approximately 0.45 mm. The bulk density (mobility) of the $Al_xGa_{1-x}$As/GaAs wafer used were $1.73\times10^{11}$ cm$^{-2}$ ($2\times10^6$ m$^2$V$^{-1}$s$^{-1}$).

Figure 5B:
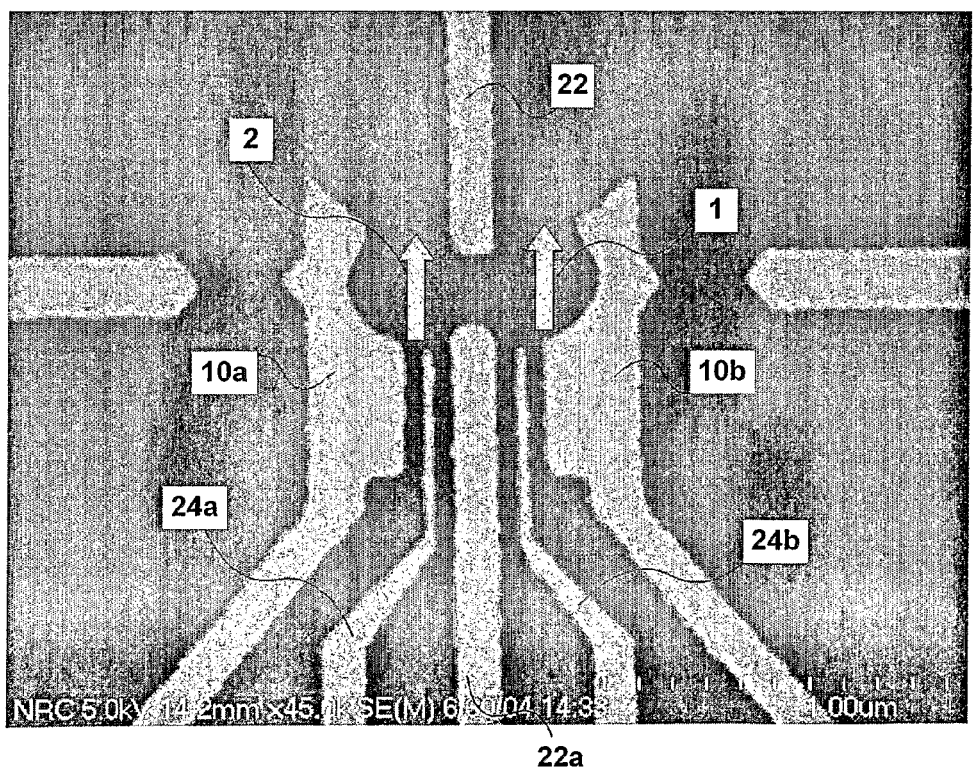

FIG. 5b shows two quantum dots 1, 2 defined by gates 10a, 22, and 22a; and 10b, 22, 22a. Gates 24a and 24b provide control electrodes. The three gate structure shown in FIG. 1 can be made in a similar manner.

Figure 1B:
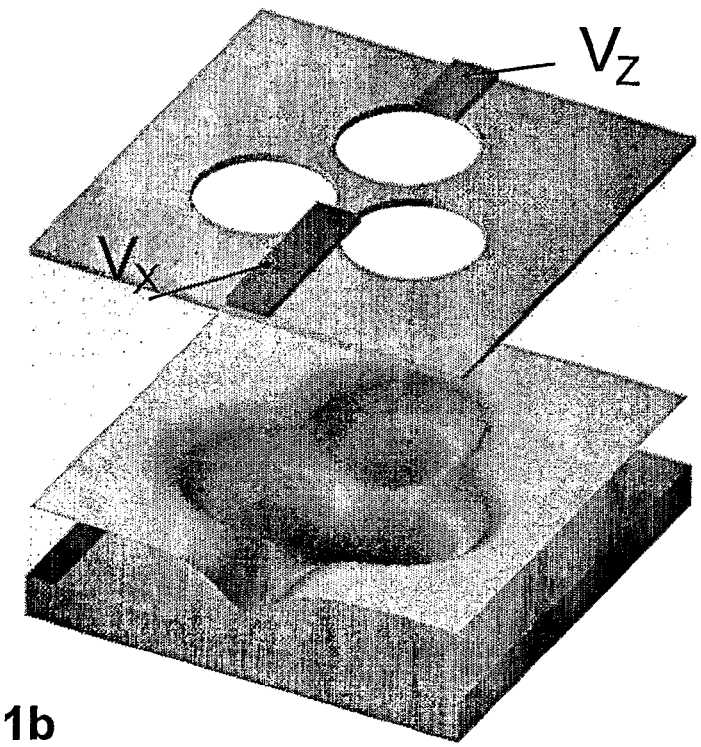
FIG. 1b shows the effect of the voltage applied to metallic gate Vx on the potential V(x,y) seen by the electron at the GaAs/GaAlAs interface.

Referring again to the structure shown in FIG. 1a, the application of a negative voltage creates a broad region depleted of electrons, with three identical minima. An additional gate, the control gate $V_x$ is positioned in-between the two adjacent dots 1 and 2. The gate $V_x$ lowers or increases the tunnelling barrier between the two dots 1,2 as shown in FIG. 1b. The effect of the gate is identical to the effect of the $\sigma_x$ operation acting on logical qubit states. The $\sigma_x$ acting on logical qubit $|0L\rangle$ transforms it into qubit $|1L\rangle$ and vice versa. The manifestation of the $\sigma_x$ operation in the energy spectrum is the energy splitting $\Delta_x$ of the two degenerate logical qubit states. Each energy level corresponds to a linear combination of the $|0L\rangle$ and $|1L\rangle$ logical states. In order to have complete logical qubit rotation, a second gate is required. This gate, labelled $V_z$, plays the role of $\sigma_z$ spin operation, and tunes the potential minimum of the third dot. Finally, we need to precisely control the number of electrons N=3 in our device. This can be accomplished by following the detailed design, which allows the number of electrons in single and coupled quantum dots to be controlled.

The operation of gates translates into the changes of a potential seen by each of the three electrons in a coded qubit. The electrostatic potential $V_E(\vec{r})$ in the electronic plane due to the gates on the surface is given by an integral over the potential $V_G(\vec{r})$ applied to the gates as $$V_E(\vec{r}) = \int \frac{d\vec{r}'}{2\pi} |D| \frac{V(\vec{r}')}{\left(D^2 + (\vec{r}-\vec{r}')^2\right)^{3/2}},$$

where D is the distance between the surface and the 2DEG layer, and $V_G(\vec{r})$ is the electrical potential on the surface, corresponding to the appropriate voltage on the gates, and equal to zero in the openings (the holes). All energies and distances are expressed in the units of effective Rydberg, $Ry=m^*e^4/2\in^2\hbar^2$, and effective Bohr radius, $a_B=\in\hbar^2/m^*e^2$, respectively. Here, e and $m^*$ are the electronic charge and effective mass, respectively, $\in$ is the dielectric constant of the semiconductor, and $\hbar$ is the Dirac's constant. For GaAs these units are 1 Ry=5.93 meV, and 1 $a_B$=97.9 Å~10 nm.

The candidate for a coded qubit investigated here has the length of the side of the rectangular gate of 22.4 $a_B$ (for better visibility of the potential minima, in FIG. 1 we only show a central part of the gate, with side length of 14 $a_B$). The diameter of the opening (the hole) in the gate is taken to be 4.2 $a_B$, the distance between the centers of each pair of holes is 4.85 $a_B$, and the distance between the gate and the 2DEG layers is 14 $a_B$. The voltage applied to the main gate corresponds to the electronic potential energy $-eV=10$ Ry in the plane of the gates. As shown in FIG. 1, the pattern of the holes in the surface gate translates into three potential minima on the electronic plane. As illustrated in FIG. 1a, if the voltage of the control gate $V_x$ is set to zero, the three potential minima are identical. But if we apply voltage $-eV=-10$ Ry, i.e., opposite to that of the main gate, the barrier between two of the dots is lowered as shown in FIG. 1b and the dots 1 and 2 are expected to be strongly coupled. The two other tunnelling barriers are weakly affected by the control gate. The voltage applied to the gates couples to the charge of the electron and determines the potential $V_E$ acting on each individual electron. The potential determines the single-electron energies $E_n$ and wave functions $\phi_n(x,y)$. The external voltages applied to control gates affect directly only single-electron properties, and through the modification of single-electron energies and wave functions—the states of the three-electron complex. To calculate the single-electron spectrum we discretize the area under the gates, and define the single-electron states $\phi_n(i,j)$ on a lattice $(x_i, y_j)$ with spacing h.

Electrons move on a lattice, and their spectrum is described by the tight-binding Hamiltonian:

$$(E_{i,j} + V_E(i, j))\phi_n(i, j) + \sum_{k,l} t_{i,j;k,l}\phi_n(k, l) = E_n\phi_n(i, j),$$

where the site energy and hopping matrix elements are given by $E_{i,j}=4\,h^{-2}$ and $t_{i,j;k,l}=-h^{-2}\,\delta_{k,i\pm 1}\delta_{l,j\pm 1}$, respectively. As a result we obtain a large, but sparse Hamiltonian matrix, which is diagonalized using the conjugate gradient method. In FIG. 2a it will be seen that the calculated energies $E_n$ corresponding to nine lowest single-particle states as a function of the potential $V_x$ of the control gate. At zero bias the spectrum consists of three energy levels, the ground state and two degenerate excited states, separated by a gap from the rest of the spectrum. The corresponding three lowest single-particle wave functions at zero bias are shown in FIG. 2b. The states and the energy spectrum can be understood by considering a linear combination of wave functions $f_m(x,y)$ localized on each m-th dot.

The corresponding ground state can be written as $$|0\rangle = 1/\sqrt{3}\,(f_1(x, y) + f_2(x, y) + f_3(x, y)),$$

and the two degenerate excited states as $$|1\rangle = 1/\sqrt{6}\,(f_1(x, y) + f_2(x, y) - 2f_3(x, y))$$
$$\text{and } |2\rangle = 1/\sqrt{2}\,(f_1(x, y) - f_2(x, y)).$$

In all of these states the electron is delocalised and shared between all dots. For negative gate voltages, i.e., when the barrier between the two dots is lowered, the two excited states mix and energy levels split. When the voltage is zero, the three dots are identical, and the two excited states are degenerate. As the barrier between the two dots is increased even further (positive gate voltages), the energies of degenerate states are split again. In this case, however, the splitting is not large. We attribute it to the fact that, in this regime, all interdot barriers are already high and the three dots are almost isolated. Therefore, a further increase of the control gate voltage increases the total energy of the system, but does not lead to a significant symmetry breaking. Now that we understand the effect of gate voltages on a single electron, we proceed to considering three electrons localized in our three-dot potential. We describe simultaneously the spin and orbital three-electron states in the language of second quantization as $|i\sigma,j\sigma',k\sigma''\rangle = c_{i\sigma}^+ c_{j\sigma'}^+ c_{k\sigma''}^+ |0\rangle$. The operator $c_{i\sigma}^+$ ($c_{i\sigma}$) creates (annihilates) an electron with spin $\sigma$ on the single-particle state $\phi_i$ calculated from Eq. 2.

The electron-electron interactions mix different three-electron configurations for a given set of applied voltages. The mixing is governed by the matrix elements of the Hamiltonian, which takes the form:

$$H = \sum_{i\sigma} E_{i\sigma} c_{i\sigma}^+ c_{i\sigma} + \frac{1}{2}\sum_{\substack{ijkl \\ \sigma\sigma'}} \langle i, j|V|k, l\rangle c_{i\sigma}^+ c_{j\sigma'}^+ c_{k\sigma'} c_{l\sigma}, \quad (3)$$

where the energies $E_{i\sigma}(V_x, V_z)$ and matrix elements $\langle i,j|V|k,l\rangle(V_x, V_z)$ of the Coulomb potential are implicit functions of the applied voltages $V_x$, $V_z$. These matrix elements are independent of spin. They are calculated in real space as $$\langle i, j|V|k, l\rangle = 2h^3 \sum_{sp,uv} \frac{\phi_i(s, p)\phi_j(u, v)\phi_k(u, v)\phi_l(s, p)}{[(s-u)^2 + (p-v)^2 + d^2]^{1/2}},$$

with parameter d accounting for the finite thickness of the electron layer (in the following example we take $d=0.2\,a_B$).

To capture spin effects we generate all possible configurations of three electrons on $N_S$ single-particle states and classify them by total spin. This allows us to construct the Hamiltonian matrix separately in the spin 3/2 and spin 1/2 basis and diagonalize these matrices numerically.

Figure 3:
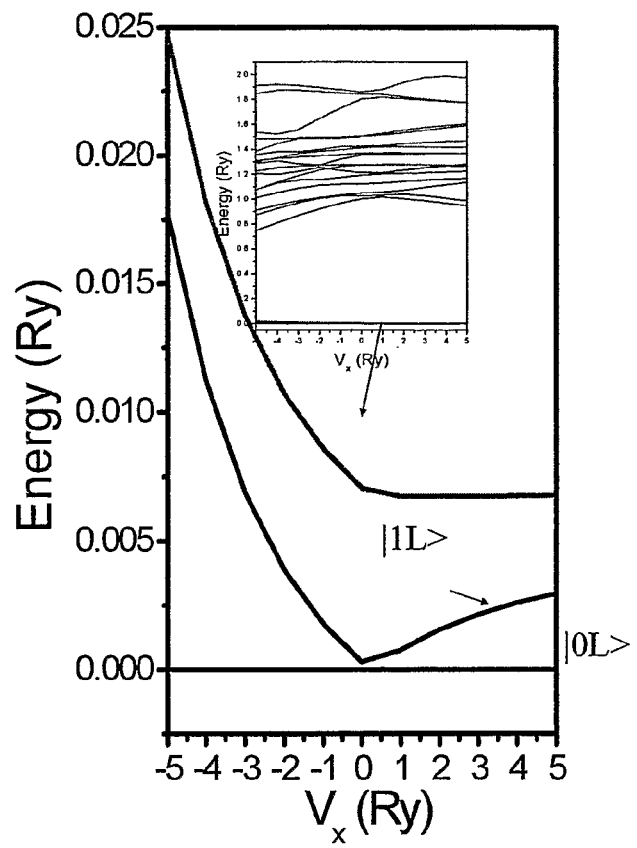
FIG. 3 shows the three lowest energies of the three-electron coded qubit as a function of the voltage applied to the control gate $V_x$ measured from the ground state. Black lines show energies of total-spin-$\frac{1}{2}$ states, the red line shows the energy of the spin-$\frac{3}{2}$ state. The inset shows the higher energies separated by a gap as a function of the gate voltage.

FIG. 3 shows the low-energy segment of the three-electron energy spectrum as a function of the voltage on the control gate $V_x$ (the energies are measured from the ground-state energy). The low-energy spectrum consists of two low-energy states corresponding to the two states of the S=1/2 Hilbert space (black lines), while the energy of the higher state corresponds to the high-spin S=3/2 state (red line). Hence the central result of this paper rests on the identification of the two lowest S=1/2 states as the two states of the coded qubit. FIG. 3 shows that they can be manipulated by applying gate voltage $V_x$. The voltage $V_x$ acts analogously to the $\sigma_x$ operation, while the $\sigma_z$ operation can be implemented by applying voltage $V_z$. Hence we have presented a design of a lateral quantum dot device acting as a voltage-tunable coded qubit.

The principle of operation of this device, and the analogy to the two-spin logical qubit states can be understood by considering a simplifying model of the coded qubit. The model starts with the single-particle spectrum of FIG. 2, described in terms of linear combinations of orbitals localised on each dot "1, 2, 3". With the energies of one localised orbital per dot denoted by $E_n$ (n=1, 2, 3), hopping matrix element $t_{n,m}$ from dot n to dot m, and on-site Coulomb repulsion U, we can analyze the coded qubit in the framework of a three-site Hubbard model. We start with the completely polarized system, i.e., one with total spin S=3/2. We can distribute our electrons on the three sites in only one way: one electron on each site, which gives a spin-polarized state $|a_{3/2}\rangle = c_{3\downarrow}^+ c_{2\downarrow}^+ c_{1\downarrow}^+|0\rangle$. As the basis of our Hilbert space consists of one configuration only, $|a_{3/2}\rangle$ is the eigenstate of our system, and its energy $E_{3/2}=E_1+E_2+E_3$. Let us now flip the spin of one of the electrons. This electron can be placed on any orbital, and as a result we can generate nine different configurations. Three of those configurations involve single occupancy of the orbitals. They can be written as $|A\rangle = c_{3\downarrow}^+ c_{2\downarrow}^+ c_{1\uparrow}^+|0\rangle$, $|B\rangle = c_{1\downarrow}^+ c_{3\downarrow}^+ c_{2\uparrow}^+|0\rangle$, and $|C\rangle = c_{2\downarrow}^+ c_{1\downarrow}^+ c_{3\uparrow}^+|0\rangle$. Out of these three configurations we construct the three eigenstates of the total spin operator. One of those eigenstates is $$|a_{3/2}\rangle = \frac{1}{\sqrt{3}}(|A\rangle + |B\rangle + |C\rangle),$$

and it corresponds to the total spin S=3/2. The two other eigenstates, $$|a_{1/2}\rangle = \frac{1}{\sqrt{2}}(|A\rangle - |B\rangle) \text{ and } |b_{1/2}\rangle = \frac{1}{\sqrt{6}}(|A\rangle + |B\rangle - 2|C\rangle),$$

correspond to the total spin S=½. The remaining six configurations involve doubly-occupied orbitals. They are $|c_{1/2}\rangle = c_{2\downarrow}^+ c_{1\downarrow}^+ c_{1\uparrow}^+ |0\rangle$, $|d_{1/2}\rangle = c_{3\downarrow}^{+c} c_{1\downarrow}^+ c_{1\uparrow}^+ |0\rangle$ $|e_{1/2}\rangle = c_{2\downarrow}^+ c_{1\downarrow}^+ c_{2\uparrow}^+ |0\rangle$, $f_{1/2}\rangle = c_{3\downarrow}^+ c_{2\downarrow}^{+c} c_{2\uparrow}^+ |0\rangle$, $g_{1/2}\rangle = c_{3\downarrow}^+ c_{1\downarrow}^+ c_{3\uparrow}^+ |0\rangle$, and $|h_{1/2}\rangle = c_{3\downarrow}^+ c_{2\downarrow}^+ c_{3\uparrow}^+ |0\rangle$. All these configurations are eigenstates of the total spin with S=½. Thus, among our nine spin-unpolarized states we have one high-spin, and eight low-spin states. In this basis the Hamiltonian matrix is block-diagonal, with the high-spin state completely decoupled. The energy corresponding to this state is equal to that of the fully polarized system discussed above, and is $E_{3/2}$. We construct the Hamiltonian matrix in the basis of the nine S=½-spin configurations by dividing them into three groups, each containing one of the singly-occupied configurations $|A\rangle = c_{3\downarrow}^+ c_{2\downarrow}^+ c_{1\uparrow}^+ |0\rangle$, $|B\rangle = c_{1\downarrow}^+ c_{3\downarrow}^+ c_{2\uparrow}^+ |0\rangle$, and $|C\rangle = c_{2\downarrow}^+ c_{1\downarrow}^+ c_{3\uparrow}^+ |0\rangle$ which are needed to construct a coded qubit. By labelling each group with an index of spin-up electron, the Hamiltonian takes the form of a 3×3 matrix:

$$\hat{H}_{1/2} = \begin{bmatrix} \hat{H}_1 & \hat{T}_{12} & \hat{T}_{13} \\ \hat{T}_{12} & \hat{H}_2 & \hat{T}_{23} \\ \hat{T}_{13} & \hat{T}_{23} & \hat{H}_3 \end{bmatrix}. \quad (4)$$

The diagonal matrix $$\hat{H}_1 = \begin{bmatrix} 2E_1 + E_2 + U_1 & t_{23} & -t_{13} \\ t_{23} & 2E_1 + E_3 + U_1 & t_{12} \\ -t_{13} & t_{12} & E_1 + E_2 + E_3 \end{bmatrix}$$

describes the interaction of three configurations which contain spin up electron on site "1", i.e., two doubly-occupied configurations $|c_{1/2}\rangle = c_{2\downarrow}^+ c_{1\downarrow}^+ c_{1\uparrow}^+ |0\rangle$ and $|d_{1/2}\rangle = c_{3\downarrow}^{+c} c_{1\downarrow}^+ c_{1\uparrow}^+ |0\rangle$, and a singly-occupied configuration $|A\rangle = c_{3\downarrow}^+ c_{2\downarrow}^+ c_{1\uparrow}^+ |0\rangle$ (in this order). The configurations with double occupancy acquire the diagonal interaction term U. The three configurations involve a pair of spin-polarized electrons (spin triplet) moving on a triangular plaquette in the presence of a "spectator" spin-up electron. Because of the triplet character of the two electrons, the phase of the hopping matrix element $-t_{13}$ from site "1" to site "3" is different from the phase of the hopping matrix element $+t_{23}$ from site "2" to site "3". The negative phase in $-t_{13}$ distinguishes singlet and triplet electron pairs, lowers the energy of the spin-polarized pair in the absence of interactions, and is a manifestation of the "molecular Hund's rule". The orbital Hund's rules are responsible for dressing up of the desired singly occupied configuration by the doubly occupied configuration, and by the interaction of the coded qubit states. It is clear that the simple model discussed here contains a rich and nontrivial behaviour. The remaining matrices corresponding to spin-up electrons localized on sites "2" and "3" can be constructed in a similar fashion:

$$\hat{H}_2 = \begin{bmatrix} E_1 + 2E_2 + U_2 & t_{23} & -t_{13} \\ t_{23} & E_1 + E_2 + E_3 & t_{12} \\ -t_{13} & t_{12} & 2E_2 + E_3 + U_2 \end{bmatrix},$$

$$\hat{H}_3 = \begin{bmatrix} E_1 + E_2 + E_3 & t_{23} & -t_{13} \\ t_{23} & E_1 + 2E_3 + U_3 & t_{12} \\ -t_{13} & t_{12} & E_2 + 2E_3 + U_3 \end{bmatrix}.$$

The interaction between them is given in terms of effective hopping matrix $$\hat{T}_{ij} = \begin{bmatrix} 0 & t_{ij} & 0 \\ t_{ij} & 0 & t_{ij} \\ 0 & t_{ij} & 0 \end{bmatrix}.$$

Figure 4:
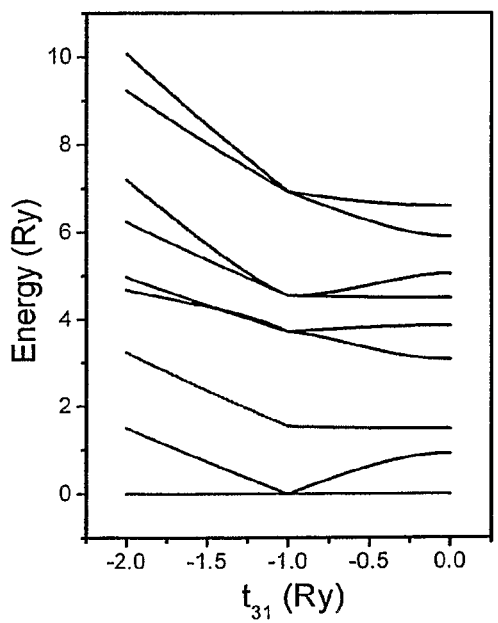
FIG. 4 shows the energies of three electrons localized on three Hubbard sites as a function of the tunnelling amplitude$_{31t}$ measured from the ground state. Onsite interaction energy $3=U$ and $t_{12}=t_{23}=1$. Black (B) and red (R) lines show energies corresponding to low- (high-)spin states.

There is no direct interaction between the configurations with single occupancy, since such scattering process would have to involve two electrons, one with spin up and one with spin down. This cannot be accomplished by the single-particle tunnelling. These states are coupled only indirectly, involving the configurations with double occupancy. The parameters of the Hubbard Hamiltonian can in principle be fitted to the numerical calculations for realistic gates. At this stage we are interested in understanding of the operation of the coded qubit. Assuming model parameters $t=-1$ and $U=3$ we diagonalize the Hamiltonian matrix as a function of the amplitude $t_{31}$ and show the resulting eigenenergies in FIG. 4.

As predicted, the two S=½ spin states cross at $t_{31}=-1$. The logical qubit states are given by $|0_L\rangle = \alpha_0 1/\sqrt{2}(|A\rangle - |B\rangle) + \beta_0 |\Delta_0\rangle$ and $|1_L\rangle = \alpha_1 1/\sqrt{6}(|A\rangle + |B\rangle - 2|C\rangle) + \beta|\Delta\rangle$ where where $|\Delta_0\rangle$, $|\Delta_1\rangle$ are contributions of doubly-occupied configurations. While these configurations render the form of the qubit not easily expressible in terms of simple singly-occupied configurations, they are responsible for the tunability of the qubit. The Hubbard model presented here both supports the numerical simulations of the voltage-controlled coded qubit as well as facilitates our understanding of its operations.

The inventors have shown that a lateral gated quantum dot device produce a voltage-tunable qubit based on electron spin.

All references listed below are incorporated herein by reference.

We claim:

1. A computing element for a quantum computer comprising at least three coupled quantum dots that can adopt more than one collective state, and at least a first gate means for applying an electric field to manipulate the collective state of said coupled quantum dots, wherein said quantum dots are arranged in a triangular formation.

2. The computing element of claim 1, wherein said coupled quantum dots are laterally adjacent each other.

3. A computing element as claimed in claim 1, wherein each quantum dot comprises a single electron.

4. A computing element as claimed in claim 3, wherein the state of said computing element is represented by the collective spin states of said single electrons.

5. A quantum computer comprising multiple computing elements as claimed in claim 1.

6. A computing element as claimed in claim 1, wherein said quantum dots are formed in a material providing a two-dimensional electron gas, and dot-forming gate means is arranged on said material to apply a voltage to locally deplete said electron gas and thereby define said quantum dots.

7. A computing element as claimed in claim 6, wherein said material is deposited as layer on a substrate.

8. A computing element as claimed in claim 7, wherein said first gate means comprises one or more pairs of fingers defining locally depleted regions to form said quantum dots.

9. A computing element as claimed in claim 8, wherein said first gate means further comprises additional electrodes extending between said pairs of fingers.

10. A computing element as claimed in claim 6, wherein said quantum dots form a tunneling barrier between them, and further comprising a second gate means for applying an electric field voltage to change said tunneling barrier.

11. A computing element as claimed in claim 10, wherein said second gate means is positioned between two of said quantum dots.

12. A computing element as claimed in claim 11, comprising a third said gate means for tuning the potential of a third said dot.

13. A computing element as claimed in claim 12, wherein said third gate means tunes the potential minimum of said third dot.

14. A computing element as claimed in claim 13, comprising a complex of three quantum dots.

15. A computing element as claimed in claim 14, wherein each quantum dot comprises a single electron.

16. A computing element as claimed in claim 6, wherein said two dimensional gas is formed in a heterostructure.

17. A computing element as claimed in claim 16, wherein said two-dimensional gas is formed at the interface of two components of said heterostructure.

18. A computing element as claimed in claim 17, wherein said heterostructure is a GaAs/AlGaAs heterostructure.

19. A method of creating a computing element for use in quantum computing comprising:
creating a two dimensional electron gas;
creating at least three coupled quantum dots in said two dimensional electron gas, said couple quantum dots having more than one collective state; and
manipulating the state of said computing element by selectively applying an electric field to said quantum dots, and wherein said quantum dots are created in said two-dimensional gas by applying an electric field.

20. A method as claimed in claim 19, wherein said two dimensional gas is created at the interface of a heterostructure.

21. A method as claimed in claim 20, wherein said heterostructure is a GaAs/AlGaAs heterostructure.

22. A method as claimed in claim 21, wherein metal gates are deposited on a surface of said heterostructure to form said quantum dots within said heterostructure.

23. A method as claimed in claim 19, wherein each quantum dot comprises a single electron.

24. A method as claimed in claim 19, wherein the state of said computing element is represented by the collective spin states of said electrons.

25. A method as claimed in claim 19, wherein said quantum dots are arranged in a triangular formation.

* * * * *